(12) United States Patent  (10) Patent No.: US 7,782,602 B2
Zhu  (45) Date of Patent: Aug. 24, 2010

(54) FLASH MEMORY DEVICE WITH IMPROVED LIGHT-GUIDING MEMBER AND COVER THEREOF

(75) Inventor: Zhi-Wen Zhu, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 20 days.

(21) Appl. No.: 12/214,884

(22) Filed: Jun. 19, 2008

(65) Prior Publication Data

US 2008/0316697 A1    Dec. 25, 2008

(30) Foreign Application Priority Data

Jun. 19, 2007    (CN) .................. 2007 2 0038735

(51) Int. Cl.
*H05K 5/03*    (2006.01)
(52) U.S. Cl. ................... 361/679.31; 361/679.4
(58) Field of Classification Search ............ 361/679.31, 361/679.4; D14/436, 356
See application file for complete search history.

(56) References Cited

U.S. PATENT DOCUMENTS 5,627,379 A * 5/1997 Bortolini ................... 250/551
7,507,119 B2 * 3/2009 Ni et al. ................. 439/607.31
2004/0143716 A1 * 7/2004 Hong ........................ 711/170
2007/0274032 A1 * 11/2007 Ni et al. .................... 361/684

FOREIGN PATENT DOCUMENTS

TW            568420        12/2003

* cited by examiner

*Primary Examiner*—Jayprakash N Gandhi
*Assistant Examiner*—Ingrid Wright
(74) *Attorney, Agent, or Firm*—Wei Te Chung; Andrew C. Cheng; Ming Chieh Chang

(57) ABSTRACT

A flash memory device includes a bottom shell, a PCB mounted on the bottom shell, a connector interface electrically connecting the PCB, a movable cover covering the PCB and a light-guiding member set on the cover. The PCB includes a LED light. The light-guiding member absorbs light of the LED light in order to averagely illuminate an area of the cover to be illuminated.

9 Claims, 4 Drawing Sheets

FLASH MEMORY DEVICE WITH IMPROVED LIGHT-GUIDING MEMBER AND COVER THEREOF

BACKGROUND OF THE INVENTION

1. Field of the Invention

This invention generally relates to a flash memory device with improved light-guiding member and a cover of the flash memory device.

2. Description of the Prior Art

Nowadays, flash memory device such as USB flash disk has been widely used as a computer peripheral storage. Generally, flash memory device includes a printed circuit board (PCB) and a cover enclosing the PCB. The PCB has a connector interface which can selectively hide in the cover or extend from the cover to be inserted into electric device in order to reach data transmission. There are a number of companies such as SanDisk, Kingston etc. providing such flash memory devices. In order to distinguish all the flash memory devices, the companies design different trademarks located thereon. The PCB usually employs a LED light to illuminate the trademarks for easy to distinguish. However, since the intension of the LED light is weak and it may not illuminate all part of the trademark if such trademark is long. As a result, some part of the trademark is bright and the other part may be dark.

Hence, it is desired to have a flash memory device and a cover thereof solving the problem above.

BRIEF SUMMARY OF THE INVENTION

A flash memory device disclosed in the preferred embodiment of the present invention includes a bottom shell, a PCB mounted on the bottom shell, a connector interface electrically connecting the PCB, a movable cover covering the PCB and a light-guiding member set on the cover. The PCB includes a LED light. The light-guiding member absorbs the light of the LED light in order to averagely illuminate a trademark of the cover.

Other objects, advantages and novel features of the invention will become more apparent from the following detailed description of the present embodiment when taken in conjunction with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE INVENTION

Reference will now be made in detail to the preferred embodiment of the present invention.

Figure 1:
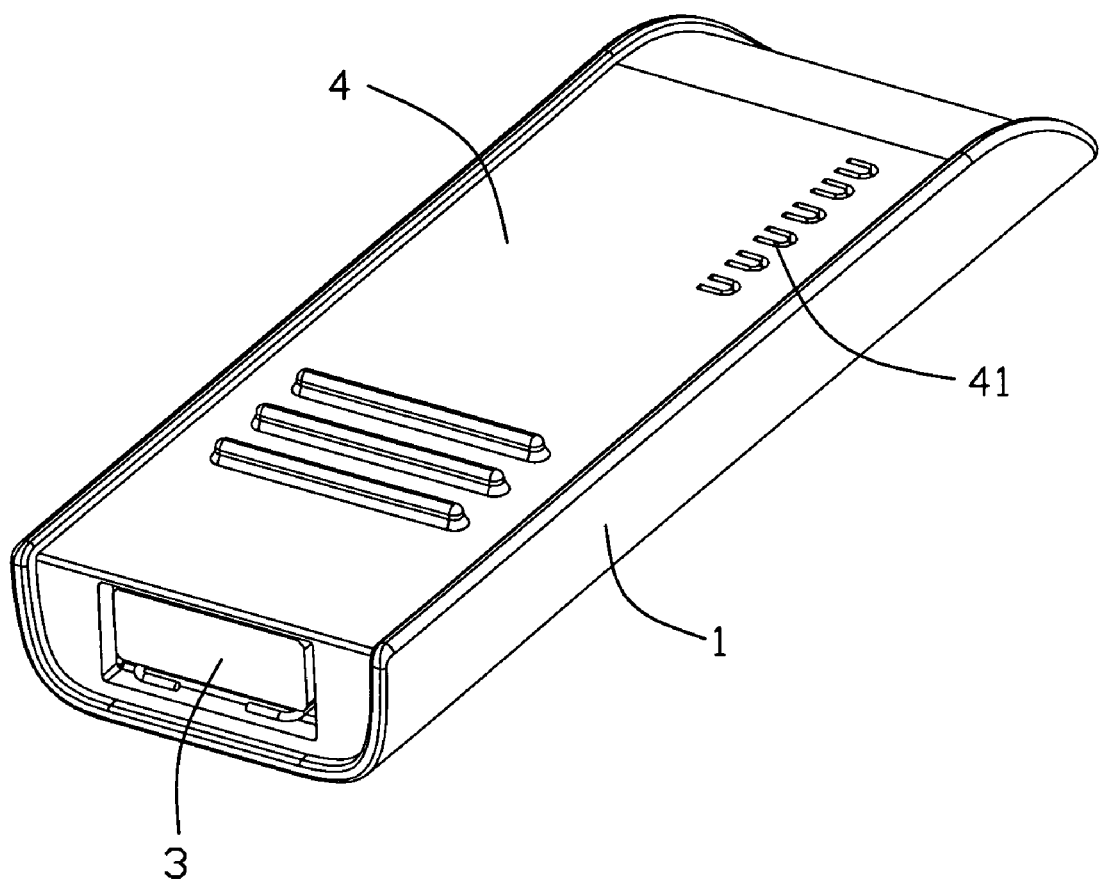
FIG. 1 is a perspective view of a flash memory device according to the preferred embodiment of the present invention.
Figure 2:
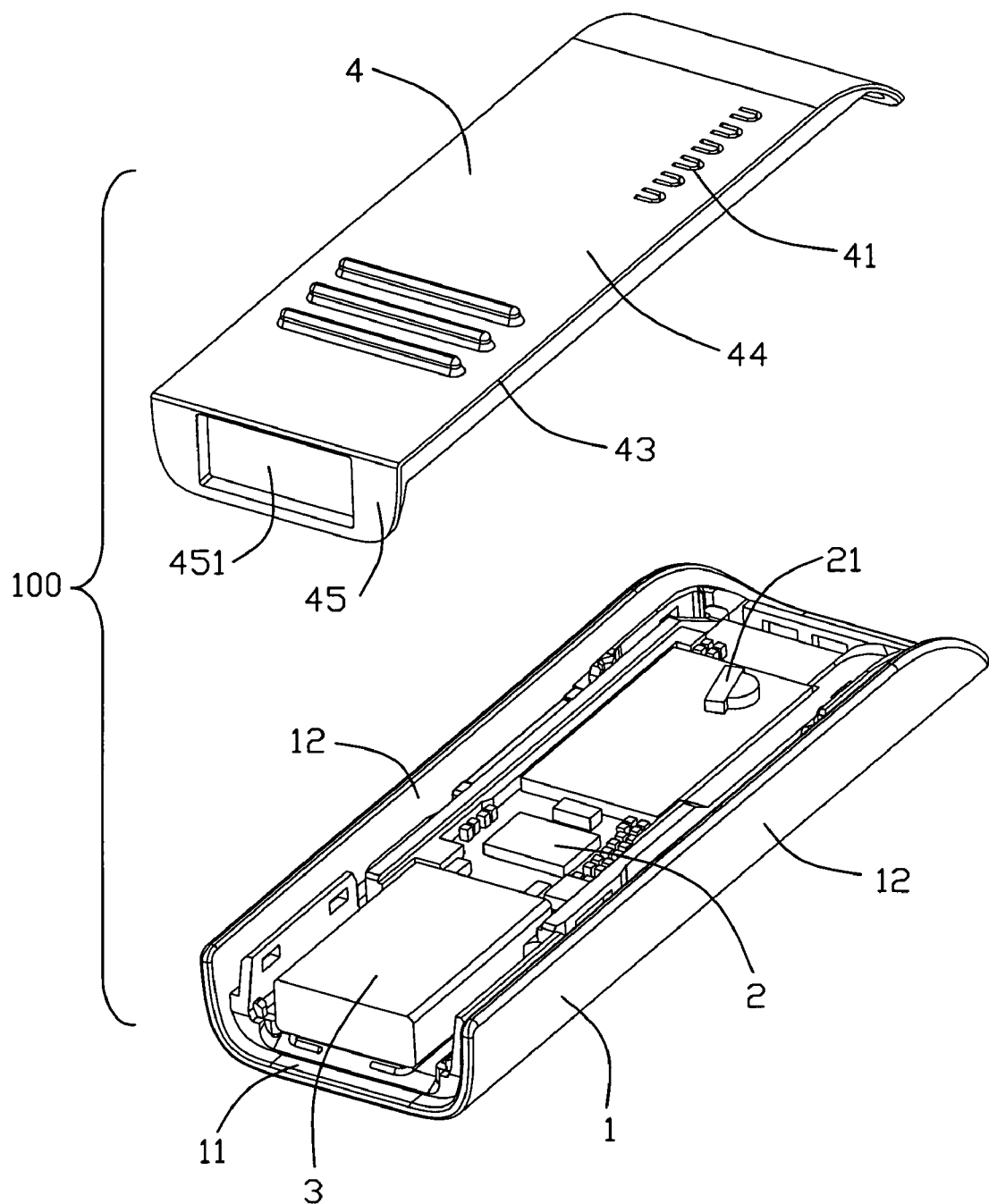
FIG. 2 is a partly exploded view of the flash memory device showing a cover apart therefrom.
Figure 3:
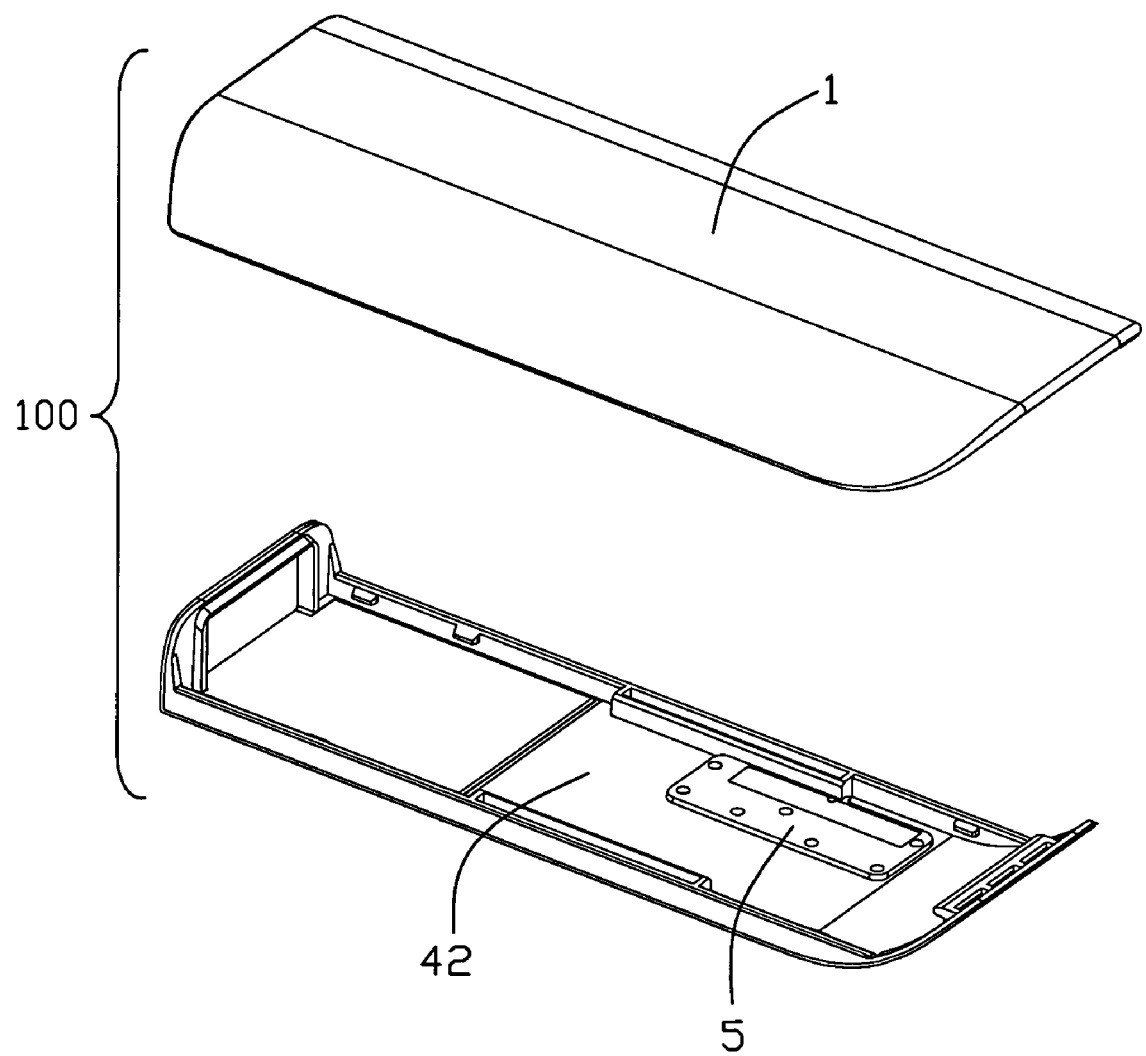
FIG. 3 is another partly exploded view of the flash memory device shown from another aspect.
Figure 4:
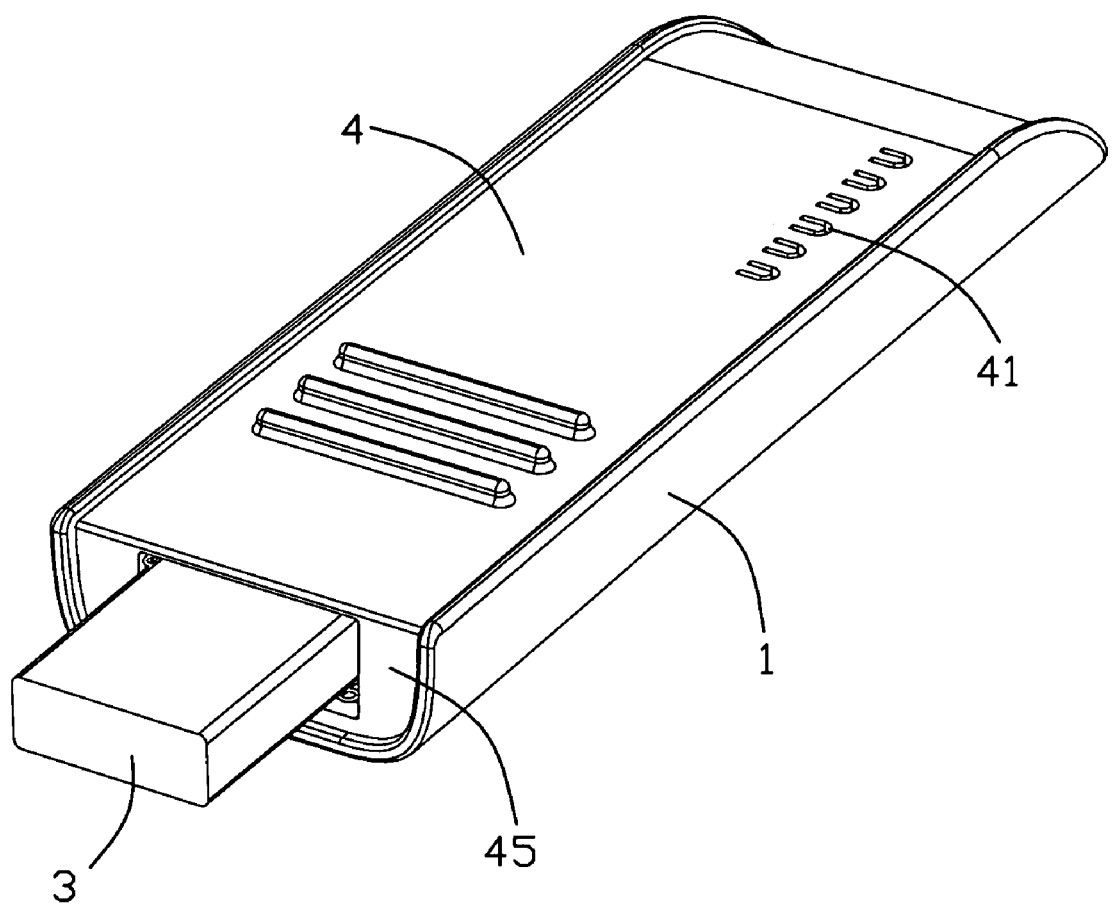
FIG. 4 is a perspective view of the flash memory device in use showing that a connector interface extends outwardly from the cover.

Referring to FIGS. 1 to 4, a flash memory device 100 includes a bottom shell 1, a printed circuit board (PCB) 2 mounted on the bottom shell 1, a connector interface 3 electrically connecting with the PCB 2, and a top cover 4 mating with the bottom shell 1. The connector interface 3 shown in the preferred embodiment is a Universal Serial Bus (USB) plug which is already known to those skill in the art. So detail description of the USB plug is omitted hereinafter and only a rectangular frame is shown instead. The PCB 2 is located between the bottom shell 1 and the top cover 4, and comprises a LED light 21. The bottom shell 1 is U-shaped from front view and comprises a bottom wall 11 and a pair of side walls 12 extending from lateral sides of the bottom wall 11. The top cover 4 is positioned between the pair of side walls 12. The top cover 4 comprises a top wall 44 and an extension 45 substantially perpendicular to the top wall 44. The top wall 44 includes an area which is trademark 41 in the preferred embodiment to be illustrated. The trademark 41 is formed by a plurality of through holes throughout the top wall 44 of the top cover 4. The extension 45 defines a rectangular slot 451 for the USB plug 3 extending therethrough. The bottom wall 11 of the bottom shell 1 extends along a longitudinal direction. The top cover 4 can linearly move with respect to the bottom shell 1 along the longitudinal direction in order to expose the USB plug 3 or make the USB plug 3 hide in the top cover 4. The flash memory device 100 further has a transparent layer 43 attached to an outer surface of the top cover 4 to prevent dust entering into the top cover 4.

In order to averagely illustrate the trademark 41, the flash memory device 100 includes a light-guiding member 5 retained on an inner surface 42 of the top cover 4. The light-guiding member 5 is made of POM material and positioned under the trademark 41. When in use, the light-guiding member 5 absorbs the light of the LED light 21 and then averagely illustrates the trademark 41.

It is to be understood, however, that even though numerous, characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. A flash memory device, comprising:
   a bottom shell;
   a printed circuit board mounted on the bottom shell and comprising a LED light;
   a connector interface electrically connecting with the printed circuit board;
   a movable cover covering the printed circuit board, the movable cover including an area to be illuminated; and
   a light-guiding member set on the movable cover;
   wherein the light-guiding member absorbs the light of the LED light and then averagely illuminates the area of the cover to be illuminated, wherein the bottom shell is U-shaped front view and comprises a bottom wall and a pair of side wall extending from lateral sides of the bottom wall, the movable cover being positioned between the pair of lateral side walls, wherein the movable cover comprises a top wall opposite to the bottom wall of the bottom shell and an extension extending substantially perpendicularly to the top wall, wherein the extension defines a rectangular slot corresponding to the connector interface, wherein the connector interface extends through the rectangular slot to be exposed outside and wherein the connector interface is a USB plug.

2. The flash memory device according to claim 1, wherein the bottom shell extends along a longitudinal direction, the movable cover linearly moving along said longitudinal direction.

3. The flash memory device according to claim 1, wherein the area of the movable cover to be illuminated is trademark.

4. The flash memory device according to claim 3, wherein the trademark is formed by a plurality of through holes.

5. The flash memory device according to claim 1, wherein the light-guiding member is positioned on an inner surface of the movable cover to directly face the LED light.

6. A cover means of a flash memory device, comprising:
   a bottom shell; and
   a cover attached to the bottom shell, the cover having a spanned area to be illuminated and a light-guiding member retained on an inner surface of the cover, the light-guiding member being positioned under said spanned area;
   wherein the light-guiding member absorbs light of a light source to averagely illuminate said spanned area of the cover, wherein the area of the cover to be illuminated is a trademark, wherein the trademark is formed by a plurality of through holes and wherein the cover includes a transparent layer attached to an outer surface of the cover.

7. The cover means of a flash memory device according to claim 6, wherein the cover is movable with respect to the bottom shell.

8. An electronic device comprising:
   an internal printed circuit board;
   an LED disposed upon the printed circuit board;
   a cover enclosing the internal printed circuit board and the associated LED thereon;
   a plurality of through holes formed in the cover to make a symbol;
   a light pipe structure located under the cover with one spanned region located around said plurality of through holes; wherein
   said light pipe structure includes another spanned region located adjacent to the LED to guide light derived from the LED toward the through holes; wherein
   said another spanned region of the light pipe structure is configured and dimensioned to be in compliance with said spanned region of the cover so as to averagely apply light to said through holes.

9. The electronic device as claimed in claim 8, wherein the cover is moveable relative to the printed circuit board.

* * * * *